United States Patent
Quek et al.

(10) Patent No.: US 6,417,056 B1
(45) Date of Patent: Jul. 9, 2002

(54) METHOD TO FORM LOW-OVERLAP-CAPACITANCE TRANSISTORS BY FORMING MICROTRENCH AT THE GATE EDGE

(75) Inventors: Elgin Quek, Singapore (SG); Ravi Sundaresan, San Jose, CA (US); Yang Pan, Singapore (SG); James Yong Meng Lee, Singapore (SG); Ying Keung Leung, Aberdeen (HK); Yelehanka Ramachandramurthy Pradeep, Singapore (SG); Jia Zhen Zheng, Singapore (SG); Lap Chan, SF, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/981,439

(22) Filed: Oct. 18, 2001

(51) Int. Cl.[7] .............. H01L 21/336; H01L 21/31; H01L 21/469; H01L 29/76; H01L 29/94
(52) U.S. Cl. .............. 438/303; 438/305; 438/785; 257/410
(58) Field of Search .............. 438/305, 229, 438/230, 303, 287, 785

(56) References Cited

U.S. PATENT DOCUMENTS

| | | | |
|---|---|---|---|
| 4,504,847 A | * 3/1985 | Nishizawa | 357/22 |
| 5,389,557 A | * 2/1995 | Jung-Suk | 437/44 |
| 5,736,446 A | * 4/1998 | Wu | 438/305 |
| 5,770,507 A | * 6/1998 | Chen et al. | 438/305 |
| 5,792,671 A | * 8/1998 | Lee | 437/44 |
| 5,793,089 A | * 8/1998 | Fulford, Jr. et al. | 257/408 |
| 5,918,134 A | * 6/1999 | Gardner et al. | 438/305 |
| 5,960,270 A | * 9/1999 | Misra et al. | 438/197 |
| 6,005,272 A | * 12/1999 | Gardner et al. | 257/344 |
| 6,008,095 A | * 12/1999 | Gardner et al. | 438/296 |
| 6,010,929 A | 1/2000 | Chapman | 438/226 |
| 6,015,741 A | * 1/2000 | Lin et al. | 438/305 |
| 6,087,208 A | * 7/2000 | Krivopapic et al. | 438/183 |
| 6,087,231 A | * 7/2000 | Xiang et al. | 438/287 |
| 6,096,595 A | * 8/2000 | Huang | 438/238 |
| 6,110,790 A | * 8/2000 | Chen | 438/305 |
| 6,117,712 A | 9/2000 | Wu | 438/163 |
| 6,127,232 A | * 10/2000 | Chatterjee et al. | 438/291 |
| 6,127,234 A | 10/2000 | Gardner et al. | 438/303 |
| 6,127,712 A | * 10/2000 | Wu | 257/410 |
| 6,271,094 B1 | * 8/2001 | Boyd et al. | 438/287 |
| 6,335,251 B2 | * 1/2002 | Miyano et al. | 438/300 |

FOREIGN PATENT DOCUMENTS

JP 5-259405 * 10/1993

* cited by examiner

Primary Examiner—Jerome Jackson, Jr.
Assistant Examiner—Shrinivas H. Rao
(74) Attorney, Agent, or Firm—George O. Saile; Rosemary L. S. Pike

(57) ABSTRACT

A method for forming a transistor having low overlap capacitance by forming a microtrench at the gate edge to reduce effective dielectric constant is described. A gate electrode is provided overlying a gate dielectric layer on a substrate and having a hard mask layer thereover. An oxide layer is formed overlying the substrate. First spacers are formed on sidewalls of the gate electrode and overlying the oxide layer. Source/drain extensions are implanted. Second spacers are formed on the first spacers. Source/drain regions are implanted. A dielectric layer is deposited overlying the gate electrode and the oxide layer and planarized to the hard mask layer whereby the first and second spacers are exposed. The exposed second spacers and underlying oxide layer are removed. The exposed substrate underlying the second spacers is etched into to form a microtrench undercutting the gate oxide layer at an edge of the gate electrode. The microtrench is filled with an epitaxial oxide layer and planarized to the hard mask layer. The dielectric layer is patterned to form third spacers on the epitaxial oxide layer. The microtrench reduces the effective dielectric constant at the overlap between the gate and the source/drain extensions to complete formation of a transistor having low overlap capacitance.

27 Claims, 6 Drawing Sheets

METHOD TO FORM LOW-OVERLAP-CAPACITANCE TRANSISTORS BY FORMING MICROTRENCH AT THE GATE EDGE

BACKGROUND OF THE INVENTION

1. Field of the Invention

The invention relates to the fabrication of integrated circuit devices, and more particularly, to a method of spacing the source drain extensions from the gate edge to lower the gate to source drain extensions capacitance in the fabrication of integrated circuits.

2. Description of the Prior Art

As the physical geometry of semiconductor devices shrinks, the channel length of the transistor is reduced as well. This leads to serious short channel effects. Lateral dopant diffusion from the source/drain extensions into the channel underlying the gate electrode will affect the threshold voltage and transistor current drive, thus affecting the device performance. Current practice involves spacing the source/drain extensions (SDE) from the gate edge using an offset spacer to lower the overlap capacitance between the gate and the SDE. However, it is desired to find a method to further lower the gate to SDE capacitance in situations where the offset spacer alone is insufficient.

U.S. Pat. No. 6,117,712 to Wu discloses a disposable spacer process for making raised source/drain devices. U.S. Pat. No. 6,127,234 to Gardner et al shows a shallow extension process using disposable spacers. U.S. Pat. No. 6,010,929 to Chapman teaches forming a nitride cap over the gate with extensions over the SDE region to space the source/drain regions from the gate.

SUMMARY OF THE INVENTION

A principal object of the present invention is to provide an effective and very manufacturable method of forming an integrated circuit device having low overlap capacitance transistors.

A further object of the invention is to provide a method of forming a transistor having low overlap capacitance by reducing effective dielectric constant value of the dielectric at the overlap between the gate and the source/drain extensions.

Yet another object is to provide a method of forming a transistor having low overlap capacitance by forming a microtrench at the gate edge to reduce effective dielectric constant value of the dielectric at the overlap between the gate and the source/drain extensions.

In accordance with the objects of this invention a method for forming a transistor having low overlap capacitance by forming a microtrench at the gate edge to minimize lateral dopant diffusion is achieved. A gate electrode is provided overlying a gate dielectric layer on a semiconductor substrate wherein a hard mask layer overlies a top surface of the gate electrode layer. An oxide layer is formed overlying the semiconductor substrate. First spacers are formed on sidewalls of the gate electrode and overlying the oxide layer. Source/drain extensions are formed in the substrate using the first spacers as a mask. Second spacers are formed on the first spacers being comprised of a material different from the first spacers. Source/drain regions are formed in the substrate using the first and second spacers as a mask. A dielectric layer is deposited overlying the gate electrode and the oxide layer and planarized to the hard mask layer whereby the first and second spacers are exposed. The exposed second spacers are removed whereby the oxide layer underlying the second spacers is exposed. The exposed oxide layer is removed whereby the semiconductor substrate underlying the second spacers is exposed. The exposed semiconductor substrate is etched into to form a microtrench wherein the microtrench undercuts the gate oxide layer at an edge of the gate electrode. The microtrench is filled with an epitaxial oxide layer and planarized to the hard mask layer. The dielectric layer is patterned to form third spacers on the epitaxial oxide layer. The effective dielectric constant at the overlap between the gate and the source/drain extensions is reduced by the microtrench thereby completing formation of a transistor having low overlap capacitance in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

It will be understood by those skilled in the art that while FIGS. 1 through 11 illustrate an N channel MOSFET integrated circuit device, a P channel FET integrated circuit device could be formed simply by substituting opposite polarities to those given for the P channel embodiment. Also, in a similar way, a CMOSFET could be formed by making both N channel and P channel devices upon the same substrate. The process of the present invention will increase the effective thickness of the gate dielectric at the edge of the gate, both by thickening the dielectric and by using a lower dielectric constant material at the gate edge.

Figure 1:
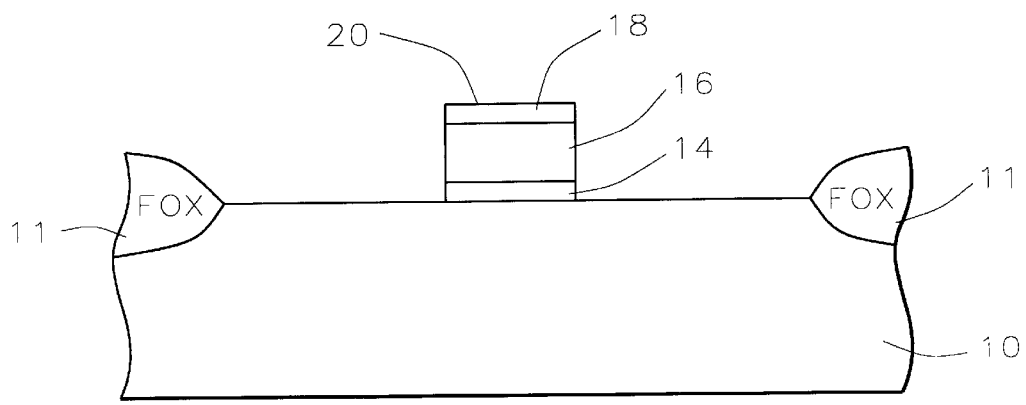
FIGS. 1 through 11 schematically illustrate in cross-sectional representation a preferred embodiment of the present invention.

Referring now more particularly to FIG. 1, there is shown an illustration of a portion of a partially completed metal oxide field effect transistor (MOSFET). The semiconductor substrate 10 is preferably composed of silicon having a (100) crystallographic orientation.

In an effort to simplify the description and the drawings the dielectric isolation between devices has been only partially shown and will not be described in detail, because they are conventional. For example, Field OXide regions FOX 11 can be formed in and on the semiconductor substrate.

A gate dielectric layer 14 is grown or deposited to a thickness of between about 12 and 65 Angstroms on the semiconductor substrate. This is an equivalent silicon dioxide thickness. The physical thickness will depend upon the dielectric constant (k) value of the gate dielectric material used. Preferably, the gate dielectric material will be a high dielectric constant material that will not be removed by a standard silicon dioxide etch process. The gate dielectric may be silicon nitride, for example.

A conductive layer 16, such as polysilicon, is deposited over the gate dielectric. A hard mask 18, such as silicon dioxide, is deposited to a thickness of between about 300 and 600 Angstroms. The hard mask, polysilicon, and gate oxide layers 18, 16, and 14 are patterned to form a gate electrode 20, as shown.

Figure 2:
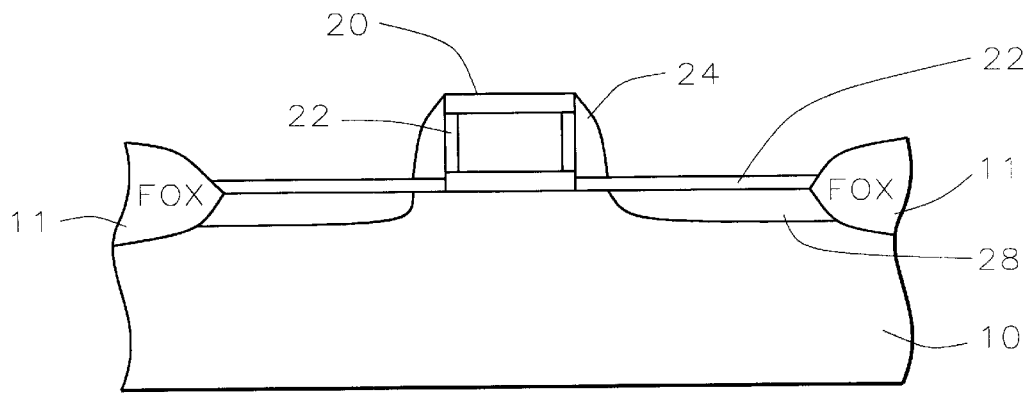

Now, referring to FIG. 2, the exposed substrate and polysilicon sidewalls are re-oxidized to form a very thin oxide layer 22, having a thickness of between about 10 and 20 Angstroms. For example, this is a dry rapid rapid thermal oxidation (RTO).

First spacers 24 are formed on the sidewalls of gate electrode 20. The spacers may comprise silicon oxide or tetraethoxysilane (TEOS) oxide. The spacers are formed by depositing the dielectric layer overlying the substrate and the gate electrode and anisotropically etching back the dielectric layer to leave the spacers 24 on the sidewalls of the gate electrode. The spacers may have a width of between about 30 and 50 Angstroms. The re-oxidation oxide layer 22 is thinner than these spacers 24. Ions are implanted into the substrate to form source/drain extensions 28, as shown in FIG. 2. The gate electrode and the first spacers act as a mask for this implantation.

Figure 3:
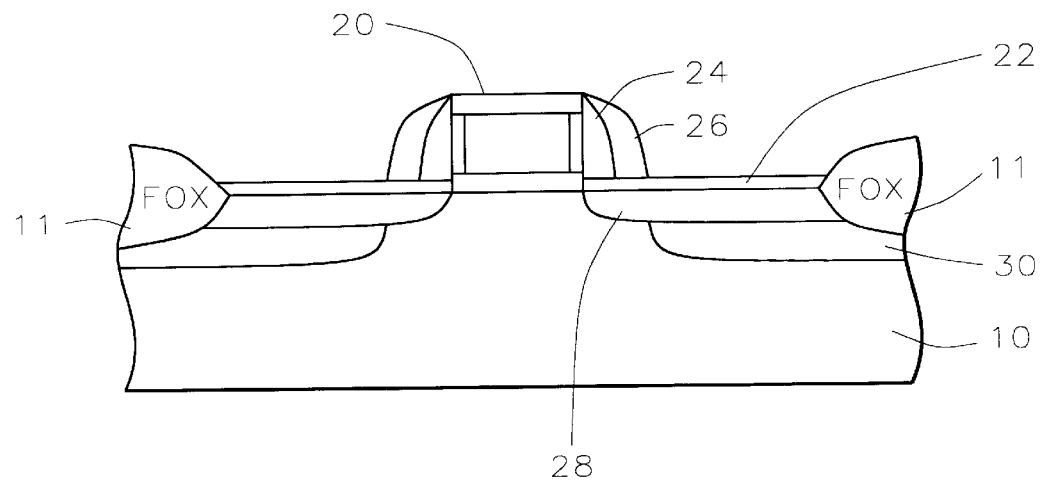

Referring now to FIG. 3, second spacers 26 are formed on the first spacers 24. The spacers 26 may comprise silicon nitride. The spacers are formed by depositing the dielectric layer overlying the substrate, the gate electrode, and the first spacers and anisotropically etching back the dielectric layer to leave the second spacers 26 on the first spacers 24 on the sidewalls of the gate electrode. The second spacers 26 may have a width of between about 60 and 100 Angstroms. Now, second ions are implanted into the substrate to form source and drain regions 30. The gate electrode and the first and second spacers act as a mask for this implantation.

Figure 4:
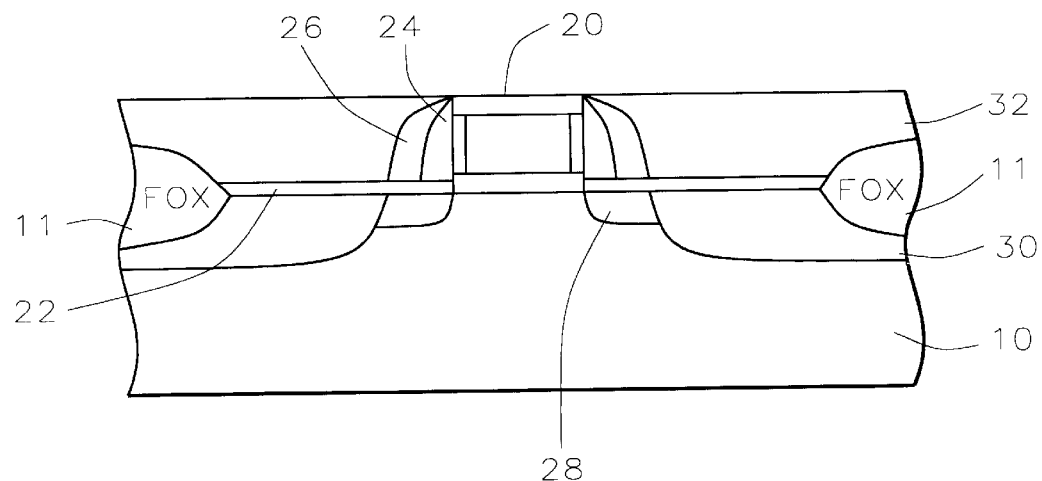

A thick oxide layer 32 is deposited over the substrate to a thickness of between about 1000 and 2000 Angstroms. This thick oxide layer may comprise plasma-enhanced TEOS oxide (PETEOS). The thick oxide layer is planarized such as by chemical mechanical polishing (CMP) down to the hard mask layer, thereby exposing the first and second spacers 24 and 26, as illustrated in FIG. 4.

Figure 5:
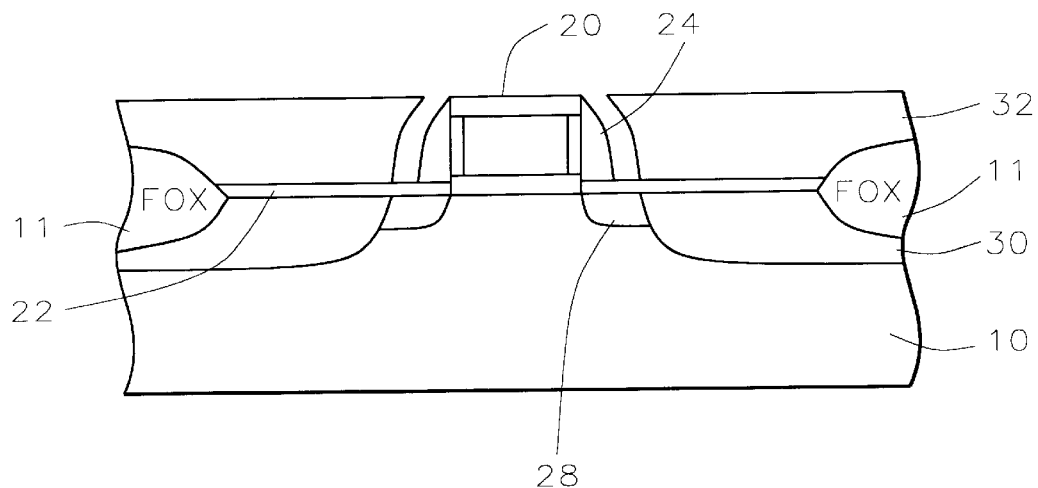

The exposed second spacers 26 are removed using a wet etch, such as hot phosphoric acid, as shown in FIG. 5.

Figure 6:
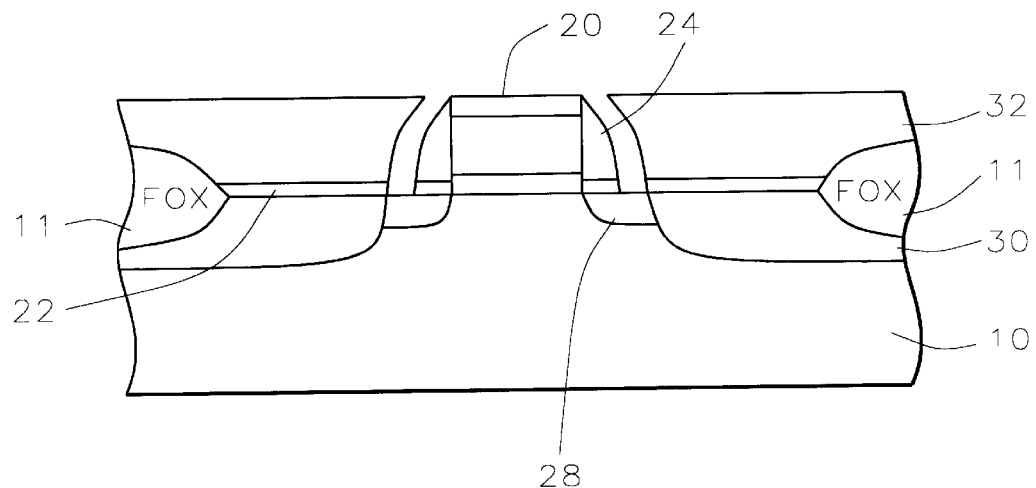

Next, referring to FIG. 6, the thin oxide layer 22 under the area previously occupied by the second spacers is removed by a short dip in hydrofluoric acid (HF).

Figure 7:
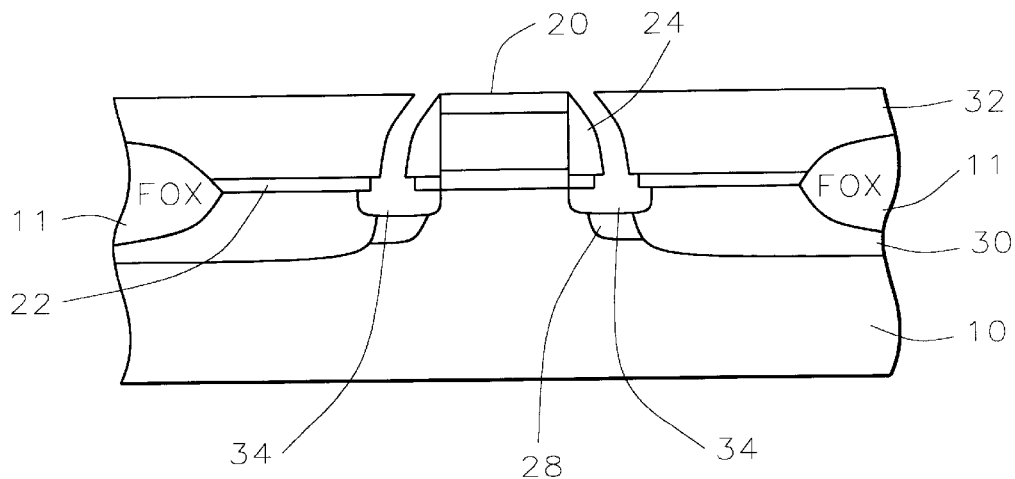

Referring now to FIG. 7, a portion of the silicon substrate is removed by a dry etch underlying the openings left by the removal of the second spacers. A downstream plasma etcher or decoupled plasma system with no ion bombardment should be used. This is a timed etch using fluorine chemistry; for example, $SF_6+O_2$, $CF_4+O_2$, $NF_3+O_2$, $F_2+O_2$, and so on, alone or in combination. The dry etching undercuts the gate dielectric at the gate edge by between about 50 and 100 Angstroms. The HF dip also undercuts the first spacers 24 by removing a portion of the thin oxide layer 22 underlying the first spacers, as shown.

This undercutting forms a microtrench 34 at the gate edge.

The microtrench has a depth into the semiconductor substrate of between about 50 and 80 Angstroms.

Figure 8:
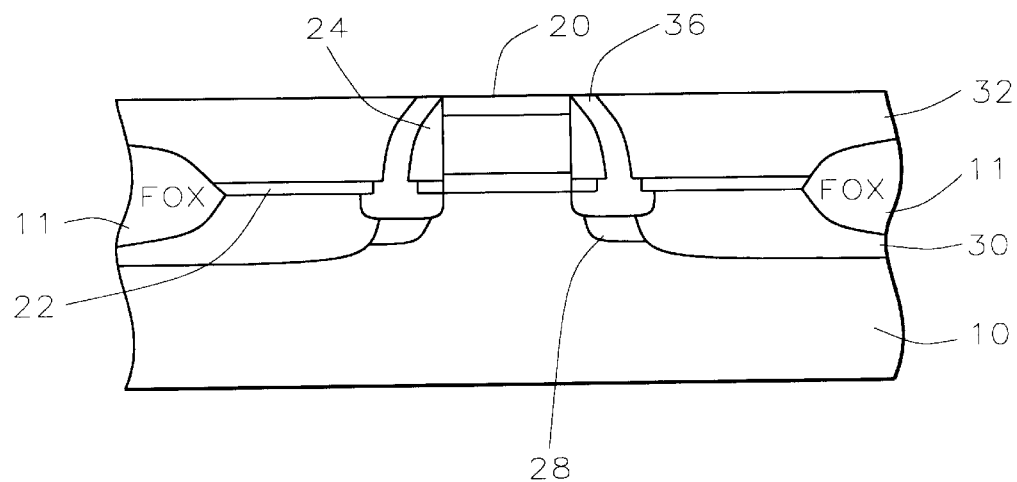

Referring now to FIG. 8, the microtrenches 34 and the openings formerly occupied by the second spacers are filled with liquid phase epitaxy oxide 36. For example, the wafers are immersed in a hydrofluorosilicic acid ($H_2SiF_6$) solution supersaturated with silicic acid at room temperature. The supersaturation is achieved by adding boric acid. The oxide layer 36 is planarized to the hard mask layer, such as by CMP.

Figure 9:
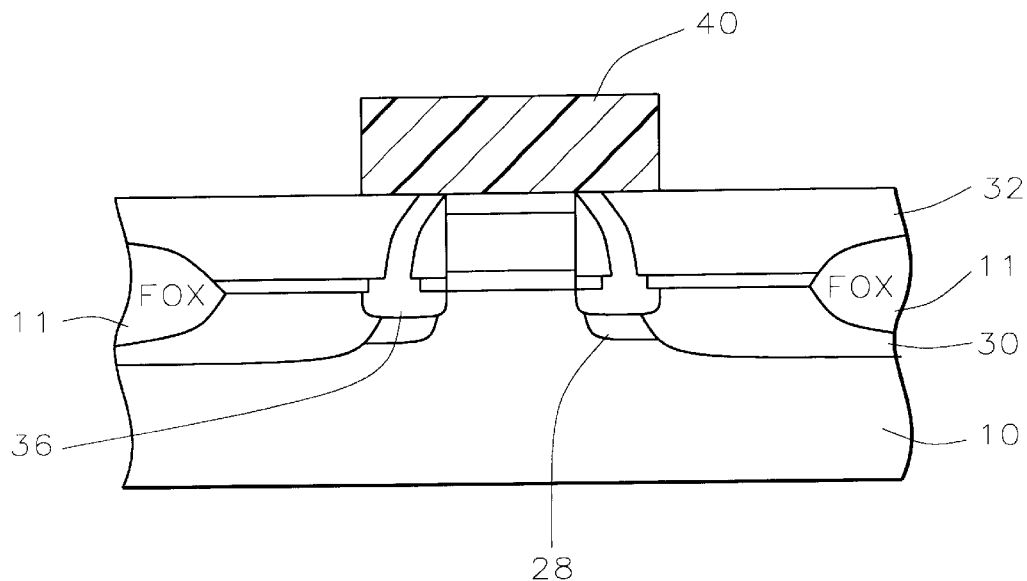
Figure 10:
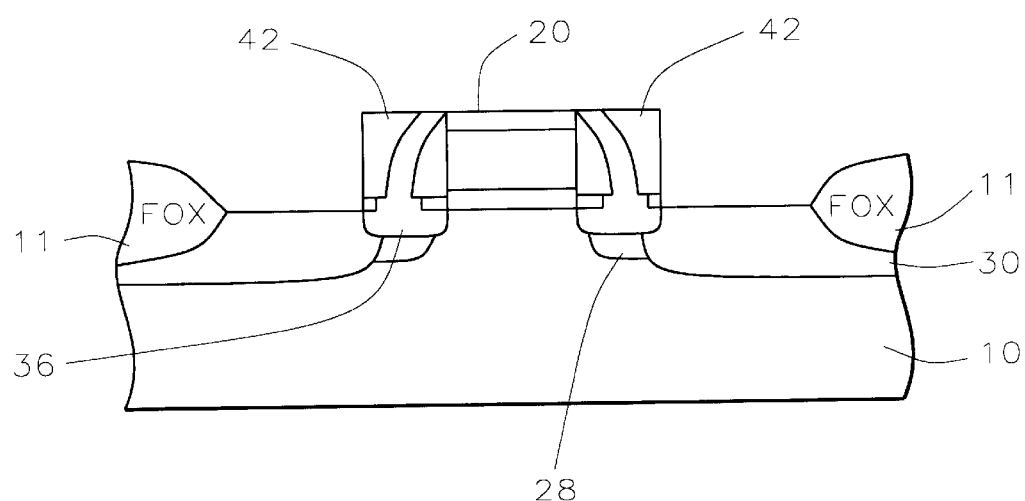

A photoresist mask 40, for example, is formed over the gate electrode and thick oxide layer 30, as shown in FIG. 9. The thick oxide layer 30 is patterned to form third spacers 42 on the oxide spacers 36. This is illustrated in FIG. 10.

Figure 11:
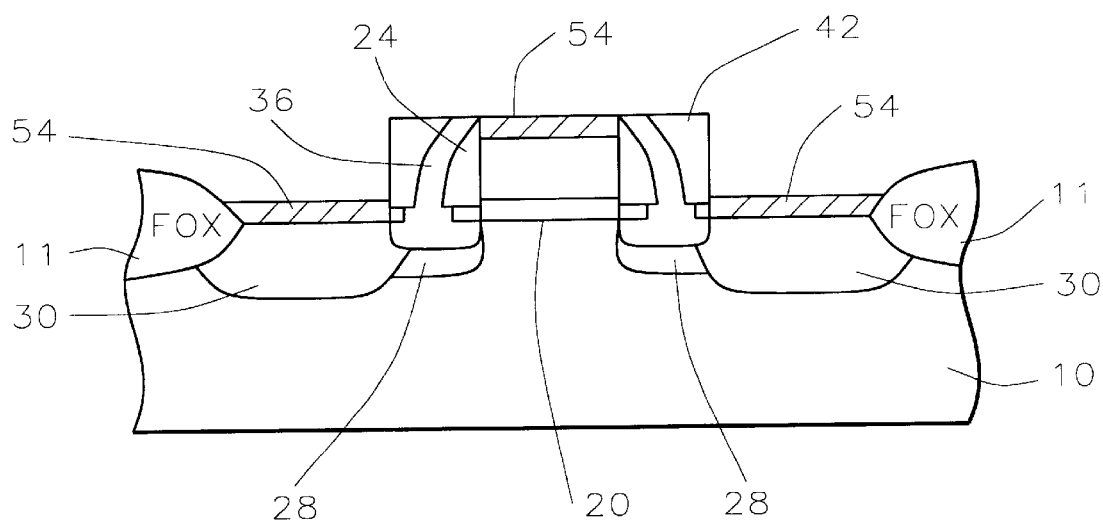

Now, the gate and source/drain regions are to be silicided. The hard mask 18 is removed over the gate electrode 20. Referring now to FIG. 11, the gate 20 and source/drain regions 30 are silicided 54 by any of the conventional methods. For example, a metal layer such as titanium or cobalt may be deposited over the substrate and the gate electrode. The wafer is subjected to an annealing process. The metal layer overlying the polysilicon gate electrode and overlying the silicon substrate in the source and drain regions 30 is transformed to a metal silicide 54. The metal overlying the spacers 41 and 36 and FOX regions 11 is unreacted. The unreacted metal is removed to complete the silicidation process.

Figure 12:
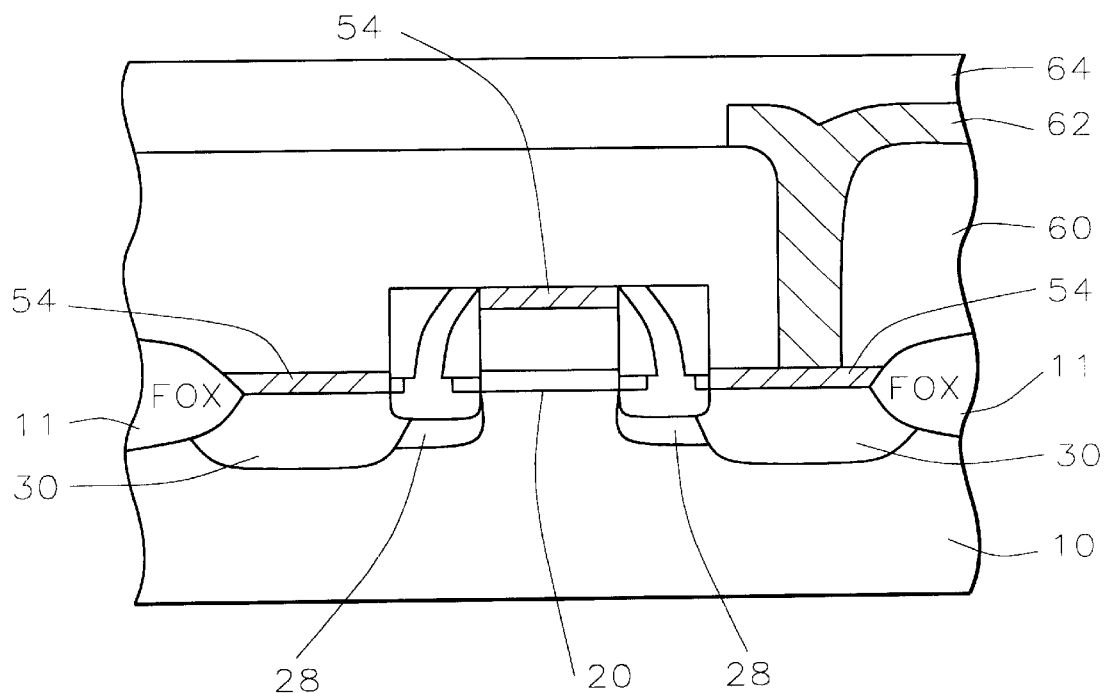
FIG. 12 schematically illustrates in cross-sectional representation a completed integrated circuit device fabricated according to the process of the present invention.

This completes the formation of the transistor with associated source/drain regions and source/drain extensions. The integrated circuit device is completed as is conventional in the art. For example, as illustrated in FIG. 12, insulating layer 60 is deposited over the surface of the substrate. Contact openings are made through the insulating layer to the underlying semiconductor devices, such as to silicided source region 30. A metal layer 62 is deposited and patterned to form electrical connections between the elements of the integrated circuit. A passivation layer 64 completes the fabrication of the integrated circuit.

The process of the invention provides a low overlap capacitance transistor. Because of the microtrench formed at the gate edge, the effective k-value of the dielectric at the overlap between the SDE and the gate is reduced. The dielectric thickness at the overlap also is increased physically. The minimal overlap between the SDE and the gate is between about 100 and 150 Angstroms. While the invention has been particularly shown and described with reference to the preferred embodiments thereof, it will be understood by those skilled in the art that various changes in form and details may be made without departing from the spirit and scope of the invention.

What is claimed is:

1. A method of forming a transistor with associated source and drain regions in the fabrication of an integrated circuit device comprising:

providing a gate electrode overlying a gate dielectric layer on a substrate wherein a hard mask layer overlies a top surface of said gate dielectric layer;

forming an oxide layer overlying said substrate and sidewalls of said gate;

forming first spacers on sidewalls of said gate electrode and overlying said oxide layer;

forming source/drain extensions in said substrate using said first spacers as a mask;

forming second spacers on said first spacers;

forming source and drain regions in said substrate using said first and second spacers as a mask;

depositing a dielectric layer overlying said gate electrode and said oxide layer and planarizing said dielectric layer to said hard mask layer whereby said first spacers and said second spacers are exposed;

removing exposed said second spacers whereby said oxide layer underlying said second spacers is exposed;

removing exposed said oxide layer whereby said semiconductor substrate underlying said second spacers is exposed;

etching into exposed said semiconductor substrate to form a microtrench wherein said microtrench undercuts said gate oxide layer at an edge of said gate electrode;

filling said microtrench with an epitaxial oxide layer and planarizing said epitaxial oxide layer to said hard mask layer; and thereafter patterning said dielectric layer to form third spacers on said epitaxial oxide layer to complete formation of said transistor and associated source and drain regions in said fabrication of said integrated circuit device.

2. The method according to claim 1 wherein said gate dielectric layer comprises a material not removed by a silicon dioxide etch process.

3. The method according to claim 1 wherein said oxide layer is formed by re-oxidizing said substrate and said gate to form said oxide layer having a thickness of between about 10 and 20 Angstroms.

4. The method according to claim 1 wherein said first oxide spacers comprise silicon dioxide or tetraethoxysilane (TEOS) oxide, and have a width of between about 30 and 50 Angstroms.

5. The method according to claim 1 wherein said oxide layer has a thickness smaller than a width of said first spacers.

6. The method according to claim 1 wherein said second spacers comprise silicon nitride and have a width of between about 60 and 100 Angstroms.

7. The method according to claim 1 wherein said dielectric layer comprises TEOS oxide deposited by plasma-enhanced chemical vapor deposition (PETEOS).

8. The method according to claim 1 wherein said step of removing said second spacers uses a wet etch.

9. The method according to claim 1 wherein said step of etching into exposed said semiconductor substrate to form a microtrench comprises a dry etch with no ion bombardment and wherein said microtrench has a depth into said semiconductor substrate of between about 50 and 80 Angstroms and wherein said microtrench undercuts said gate oxide layer at said gate edge by between about 50 and 100 Angstroms.

10. The method according to claim 1 wherein said step of filling said microtrench with an epitaxial oxide layer is a liquid phase epitaxy process comprising immersing said substrate in a hydrofluorosilicic acid solution supersaturated with silicic acid at room temperature.

11. The method according to claim 1 further comprising siliciding said gate electrode and said source and drain regions.

12. A method of forming a transistor with associated source and drain regions in the fabrication of an integrated circuit device comprising:

providing a gate electrode overlying a gate dielectric layer on a substrate wherein a hard mask layer overlies a top surface of said gate dielectric layer;

forming a first oxide layer overlying said substrate and sidewalls of said gate;

forming oxide spacers on sidewalls of said gate electrode and overlying said first oxide layer;

forming source/drain extensions in said substrate using said oxide spacers as a mask;

forming nitride spacers on said oxide spacers;

forming source and drain regions in said substrate using said oxide and said nitride spacers as a mask;

depositing a second oxide layer overlying said gate electrode and said first oxide layer and planarizing said second oxide layer to said hard mask layer whereby said oxide spacers and said nitride spacers are exposed;

removing exposed said nitride spacers whereby said first oxide layer underlying said nitride spacers is exposed;

removing exposed said first oxide layer whereby said substrate underlying said nitride spacers is exposed;

etching into exposed said substrate to form a microtrench wherein said microtrench undercuts said gate oxide layer at an edge of said gate electrode;

filling said microtrench with an epitaxial oxide layer and planarizing said epitaxial oxide layer to said hard mask layer; and thereafter patterning said second oxide layer to form third spacers on said epitaxial oxide layer to complete formation of said transistor and associated source and drain regions in said fabrication of said integrated circuit device.

13. The method according to claim 12 wherein said first oxide layer is formed by re-oxidizing said substrate and said gate to form said first oxide layer having a thickness of between about 10 and 20 Angstroms.

14. The method according to claim 12 wherein said oxide spacers comprise silicon oxide or TEOS oxide and have a width of between about 30 and 50 Angstroms.

15. The method according to claim 12 wherein said first oxide layer has a thickness smaller than a width of said oxide spacers.

16. The method according to claim 12 wherein said nitride spacers comprise silicon nitride and have a width of between about 60 and 100 Angstroms.

17. The method according to claim 12 wherein said second oxide layer comprises PETEOS oxide.

18. The method according to claim 12 wherein said step of removing said nitride spacers uses a wet etch in hot phosphoric acid.

19. The method according to claim 12 wherein said step of etching into exposed said semiconductor substrate to form a microtrench comprises a dry etch with no ion bombardment and wherein said microtrench has a depth into said substrate of between about 50 and 80 Angstroms and wherein said microtrench undercuts said gate oxide layer at said gate edge by between about 50 and 100 Angstroms.

20. The method according to claim 12 wherein said step of filling said microtrench with an epitaxial oxide layer is a liquid phase epitaxy process comprising immersing said substrate in a hydrofluorosilicic acid solution supersaturated with silicic acid at room temperature.

21. The method according to claim 12 further comprising siliciding said gate electrode and said source and drain regions.

22. A method of forming a transistor with associated source and drain regions in the fabrication of an integrated circuit device comprising:

providing a gate electrode overlying a gate dielectric layer on a substrate wherein a hard mask layer overlies a top surface of said gate dielectric layer;

re-oxidizing said substrate and said gate to form a first oxide layer overlying said substrate and sidewalls of said gate;

forming oxide spacers on sidewalls of said gate electrode and overlying said first oxide layer;

forming source/drain extensions in said substrate using said oxide spacers as a mask;

forming nitride spacers on said oxide spacers;

forming source and drain regions in said substrate using said oxide and said nitride spacers as a mask;

depositing a second oxide layer overlying said gate electrode and said first oxide layer and planarizing said second oxide layer to said hard mask layer whereby said oxide spacers and said nitride spacers are exposed;

removing exposed said nitride spacers whereby said first oxide layer underlying said nitride spacers is exposed;

removing exposed said first oxide layer whereby said substrate underlying said nitride spacers is exposed;

etching into exposed said substrate to form a microtrench wherein said microtrench undercuts said gate oxide layer at an edge of said gate electrode;

immersing said substrate in a hydrofluorosilicic acid solution supersaturated with silicic acid at room temperature whereby said microtrench is filled with an epitaxial oxide layer and planarizing said epitaxial oxide layer to said hard mask layer; and thereafter patterning said second oxide layer to form third spacers on said epitaxial oxide layer to complete formation of said transistor and associated source and drain regions in said fabrication of said integrated circuit device.

23. The method according to claim 22 wherein said oxide spacers comprise silicon oxide or TEOS oxide and have a width of between about 30 and 50 Angstroms.

24. The method according to claim 22 wherein said nitride spacers comprise silicon nitride and have a width of between about 60 and 100 Angstroms.

25. The method according to claim 22 wherein said step of removing said nitride spacers uses a wet etch in hot phosphoric acid.

26. The method according to claim 22 wherein said step of etching into exposed said semiconductor substrate to form a microtrench comprises a dry etch with no ion bombardment and wherein said microtrench has a depth into said substrate of between about 50 and 80 Angstroms and wherein said microtrench undercuts said gate oxide layer at said gate edge by between about 50 and 100 Angstroms.

27. The method according to claim 22 further comprising siliciding said gate electrode and said source and drain regions.

* * * * *

UNITED STATES PATENT AND TRADEMARK OFFICE
CERTIFICATE OF CORRECTION

PATENT NO. : 6,417,056 B1
DATED : July 9, 2002
INVENTOR(S) : Elgin Quek et al.

It is certified that error appears in the above-identified patent and that said Letters Patent is hereby corrected as shown below:

<u>Title page,</u>
Item [75], please delete "Ying Keung Leung, Aberdeen (HK), and replace with
-- Ying Keung Leung, Hong Kong, (HK) --.
Please delete "Lap Chan, SF, CA (US)", and replace with -- Lap Chan, San Francisco, CA (US) --.

Signed and Sealed this

Fourth Day of February, 2003

JAMES E. ROGAN
*Director of the United States Patent and Trademark Office*